United States Patent [19]
Hiruta et al.

[11] Patent Number: 5,830,307
[45] Date of Patent: Nov. 3, 1998

[54] PRODUCTION METHOD FOR SUBSTRATE HAVING PROJECTING PORTIONS

[76] Inventors: Kengo Hiruta, 12-2-603, Kyonan-cho 2-chome, Musashino-shi, Tokyo, Japan; Young Saeng Kim, 206-138, ChonNong 4 Dong, DongDaeMoon-Ku, Seoul, Rep. of Korea

[21] Appl. No.: 513,156

[22] Filed: Aug. 9, 1995

[30] Foreign Application Priority Data

Aug. 10, 1994 [JP] Japan .................................. 6-188502
Jan. 10, 1995 [JP] Japan .................................. 7-002302

[51] Int. Cl.⁶ .................................................. B32B 31/00
[52] U.S. Cl. .................. 156/272.4; 156/247; 156/273.9; 156/277; 264/427; 427/96; 427/256; 427/258; 427/261; 427/282; 427/288; 427/595; 427/598; 428/141; 428/901
[58] Field of Search .............................. 156/247, 272.4, 156/273.9, 277; 264/427; 427/282, 598, 96, 256, 258, 261, 288, 595; 428/141, 151

[56] References Cited

FOREIGN PATENT DOCUMENTS 2336258 11/1976 France .
53-133109 11/1978 Japan .
4-298353 10/1992 Japan .

*Primary Examiner*—Fred Teskin
*Attorney, Agent, or Firm*—Pearne, Gordon, McCoy and Granger LLP

[57] ABSTRACT

A method for manufacturing a substrate having a surface with projections. A printing plate, with a least one part formed from a ferromagnetic material, and which has viscous material penetrating portions for forming projections on a flat surface, is brought into contact with the surface of a substrate. The printing plate is then clamped to the substrate by means of attraction by a magnetic force from behind the substrate. The viscous material penetrating portions of the printing plate are filled up with a viscous material for forming projections. The viscous material forms a layer on the substrate in a shape that is the same as that of the projections. The printing plate is separated from the substrate and the viscous material printed onto the substrate solidifies to form the projections.

15 Claims, 6 Drawing Sheets

PRODUCTION METHOD FOR SUBSTRATE HAVING PROJECTING PORTIONS

BACKGROUND OF THE INVENTION

1. Field the Invention

The invention of the present application relates to a method of production for a substrate having minute indentations on its surface for use with flat display panel back boards, printed circuit boards, and the like.

2. Background Art

Liquid crystal displays (LCD), electroluminescence displays (ELD), plasma display panels (PDP), vacuum fluorescent displays (VFD), and the like are presently practically used as flat display panels for visual display units for televisions, computers and the like.

A common feature in these flat display panels is the installation of insulated substrates on which a plurality of electrodes are arranged in high density. In this type of insulated substrate, the electrode intervals are formed into minute partitions in order to separate the electrodes.

FIG. 8 shows an example of the basic structure of a PDP. Insulated substrate (the back board) 1 is formed from glass or the like, and there are a plurality of parallel electrode grooves 4 of 100–200 $\mu$m in depth separated at regular 50 $\mu$m intervals formed on the upper surface. In these respective grooves, wire auxiliary anodes 2 are housed in parallel, and separated from each other by partitions located between the electrode grooves 4. A plurality of cathodes shaped in long narrow sheets extending in a direction intersecting auxiliary anodes 2 are arranged on the back board 1. Furthermore, a plurality of display anodes and a front plate (not shown in the figure) are arranged on these cathodes.

With PDPs like those mentioned above, it is desirable to increase the density of the electrode grooves 4 formed in the substrate back board 1 in order to increase the picture element density. However, there is a limit to increasing the density of the electrode grooves 4 above present levels due to the grinding processes, shot blasting processes, and the like carried out to form the electrode grooves 4 on the surface of the glass substrate. In addition, because processing of the glass substrate takes time, production efficiency is low, and the high cost of production of the back board 1 are draw backs. On the one hand, the technique of using thick printing to form partitions on the glass substrate 1 has been studied, but there are limitations to the accuracy and printing thickness of viscous materials, and maintaining the accuracy of the shape and the 100–200 $\mu$m height of the partitions are problems.

Furthermore, forming partitions by forming grooves in the back board 1 by etching has also been examined, but its ability to produce partitions of high accuracy is limited to a height of about 30 $\mu$m, and it fails to solve the above-mentioned problems.

In addition, the above mentioned liquid crystal display (LCD), electroluminescence display (ELD), plasma display pane (PDP), and vacuum fluorescent display (VFD), and the like also use a insulated board which has a minute partition structure similar to PDP, and also have similar problems.

In addition, even with regard to print boards formed by metallic foil circuit patterns on substrates, reduction in manufacturing costs, improvements in the circuit pattern pitch and the thinness of the accumulations are strongly needed, but compatibility with current etching methods is a problem.

SUMMARY OF THE INVENTION

The first objective of the invention of the present application is to provide a method with a high processing accuracy for inexpensively and efficiently manufacturing substrates having minute projections To achieve this objective, the invention of the present application possesses the following processes:

A manufacturing method for a substrate having a surface with projections comprising the steps of:

preparing a printing plate, with at least one part formed from a ferromagnetic material, and which has viscous material penetrating portions for forming projections on a flat surface; contacting said printing plate with the surface of a substrate; clamping said printing plate to said substrate by means of attraction by a magnetic force from behind said substrate; filling said viscous material penetrating portions of said printing plate with a viscous material for forming projections; forming from said viscous material a layer on said substrate in a shape the same as that of said projections; separating said printing plate from said substrate; and solidifying said viscous material printed onto said substrate forming projections.

In this method, a printing plate is fixed to a substrate base by means of magnetic attraction; a viscous material is rubbed into viscous material penetrating portions of the printing plate; and even with thick printing plates are used to produce thick protrusions, the printing plate can be fixed with certainty and smudging is prevented. consequently, distortions of viscous material are not produced, printing position accuracy is high, projections of a desired shape can be easily formed with high precision and the substrate manufacturing costs can be reduced. In addition, as the set up of the shape of the projections is formed by the viscous material penetrating portions of printing plate, freedom in the design and position of the projecting portions is high.

In the method of the invention of the present invention the viscous material is rubbed into the viscous material penetrating portions in the surface of the printing plate by means of a squeegee which has a rubbing action. By this method it is possible to rub with certainty the viscous material into the viscous material penetrating portions and accurately produce projections of one or more layers.

In addition, in the method of the invention of the present application, after the aforementioned printing process, the printing plate can be peel off the surface of the substrate by means of magnetic attraction, thereby making it possible stablely separate the printing plate without producing any strain, and lift printing plate exactly in the direction of the projecting portions, so that the shape of projecting portions is not damaged.

DETAILED DESCRIPTION OF THE PREFERRED EMBODIMENTS

Figure 1:
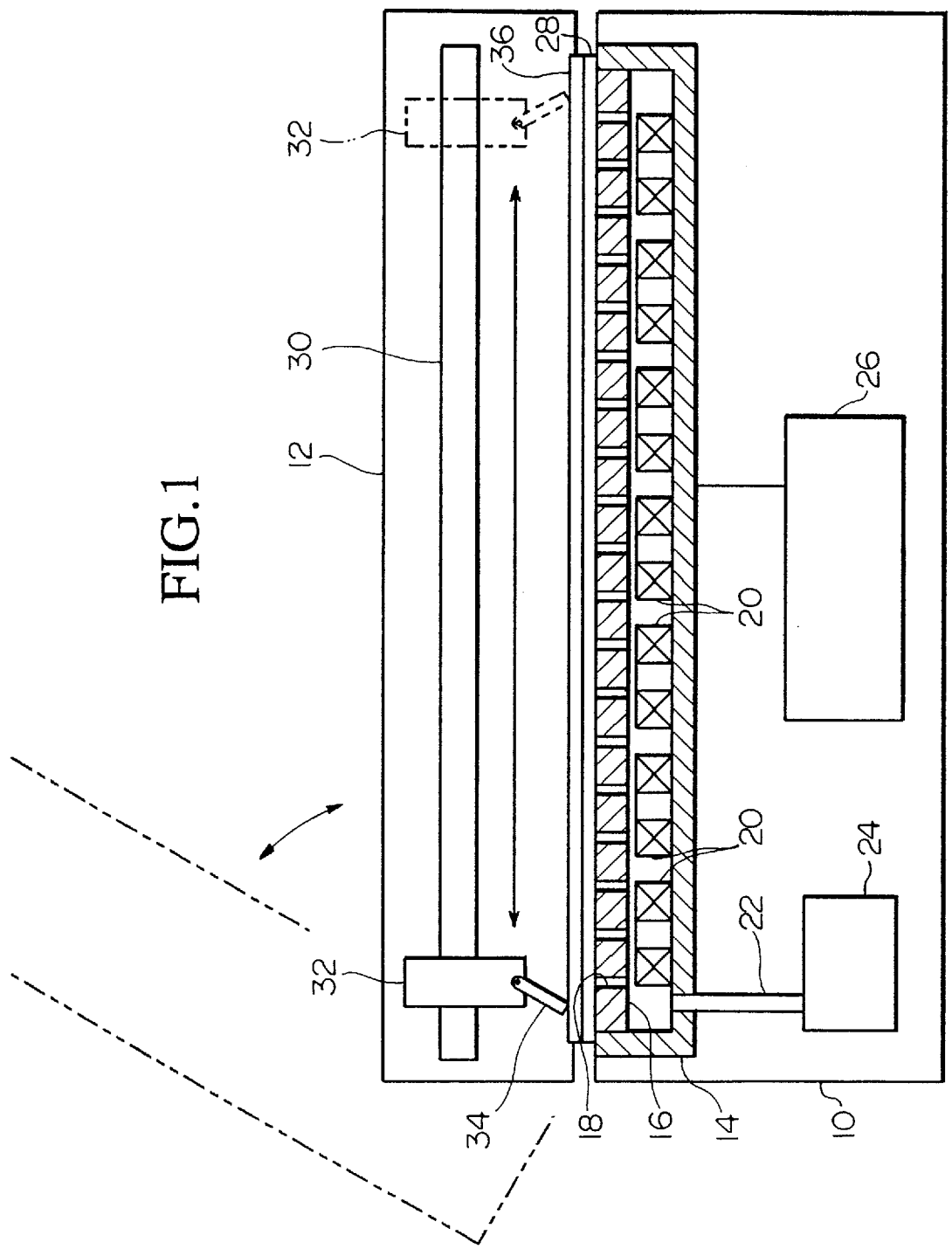
FIG. 1 is a cross sectional view of a device used in a substrate manufacturing process according to the present invention.

FIG. 1 shows a side view of an example of a printing apparatus used in the manufacturing method of the present invention for producing substrates having projections.

On the upper portion of main base 10, an opening/closing base 12 is provided which is hinged at one end and can be rotated around this hinge. A box shaped air tight container 14 is arranged horizontally in the upper portion of main base 10. The upper surface of the air tight container 14 is covered by a rectangular substrate supporting plate 16. There are a plurality of small ventilation holes 18 formed in substrate supporting plate 16. Air tight container 14 is connected through a pipe 22 to a pressure reduction device 24. When the pressure of the inside of air tight container 14 is reduced by the action of pressure reduction device 24, air is sucked out of all the ventilation holes 18, and the substrate 28 arranged above the ventilation holes 18 can be made to adhere to the upper surface of main base 10.

Within air tight container 14, extending across the whole lower surface of the inside of airtight container 14 are a plurality of electromagnets 20 arranged lengthwise and crosswise at fixed intervals. These electromagnets 20 are each connected to electric supply mechanism 26. When electric mechanism 26 is turned on a magnetic force is generated, and a printing plate 36 provided above substrate 28 is attracted.

Squeegee driving mechanism 30 is positioned along the longitudinal direction of opening/closing mechanism 12. A slider 32 which is movable in the above-mentioned longitudinal direction is positioned on squeegee driving mechanism 30. On the lower edge of slider 32, a squeegee 34, is attached perpendicularly and is tiltable on both sides at a fixed angle. The squeegee 34 is formed from an elastic material such as rubber with an entire length equal to the lateral width of the printing plate 36, so that when slider 32 moves, the squeegee rubs the entire area of the printing plate. At this time, squeegee 34 is tilted so as to form an acute angle with printing plate 36 in the direction of progress. In this case, the front side, with respect to the direction of movement, of squeegee 34 is always inclined at an acute angle to printing plate 36, thereby obtaining an action wherein viscous material I (FIG. 2) is rubbed into the viscous material penetrating portions 36A of printing plate 36.

Figure 2:
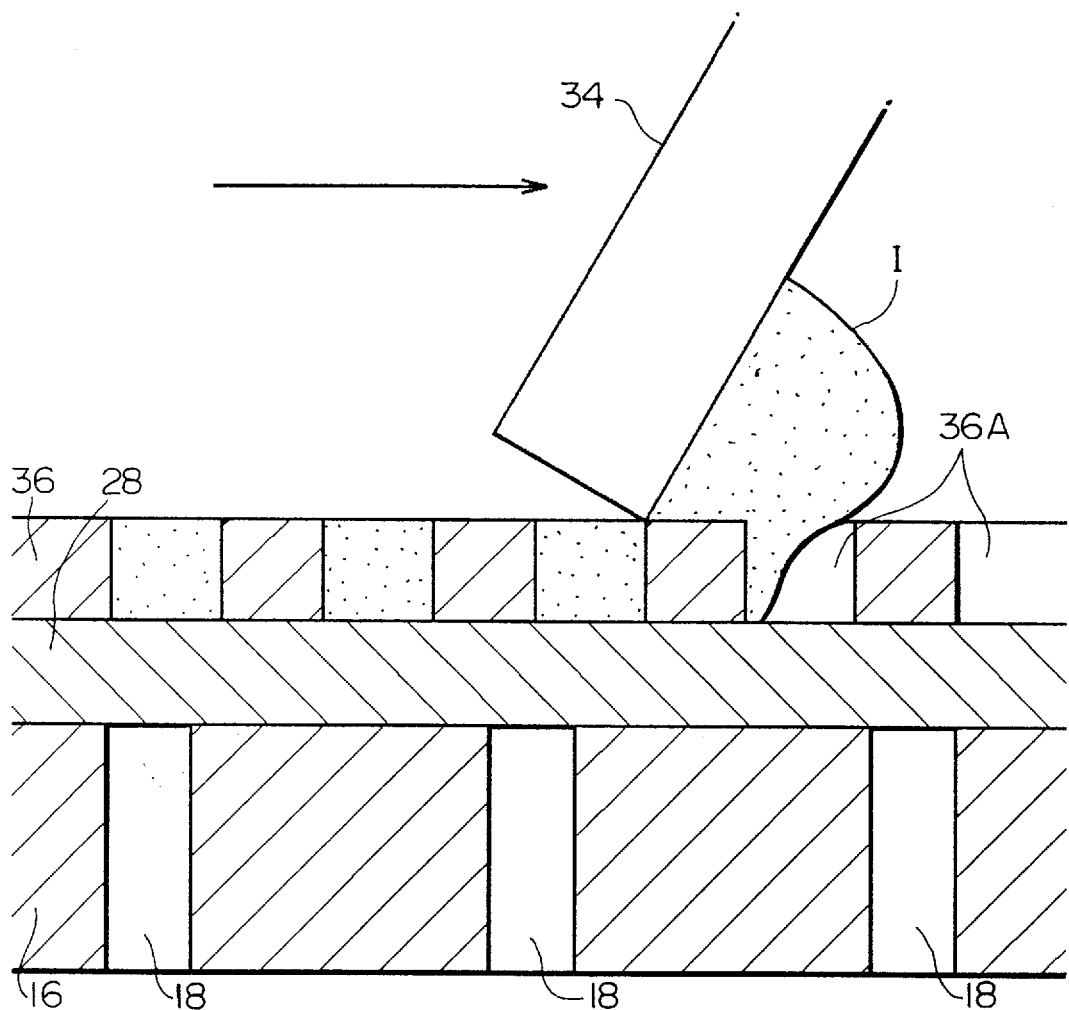
FIG. 2 is an enlarged cross sectional view of a section of the same embodiment showing viscous material being rubbed into the printing plate.
Figure 4:
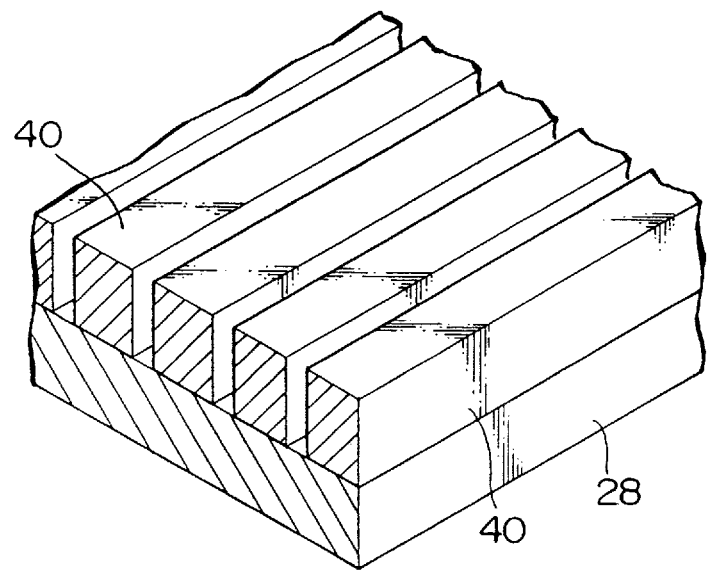
FIG. 4 is a perspective view of a substrate with projections manufactured according to the same embodiment.
Figure 5:
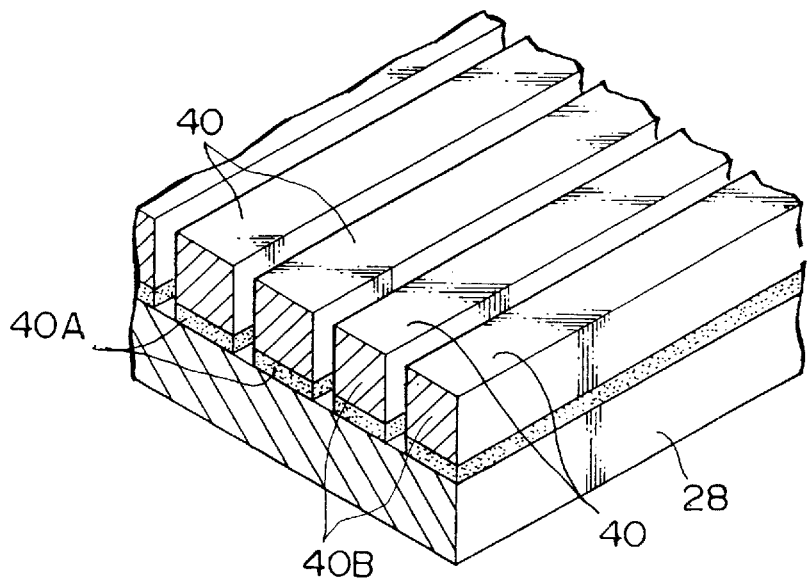
FIG. 5 is a perspective view of a substrate having projections manufactured according to a method of another embodiment of the present invention.

Printing plate 36 has a ferromagnetism extending over its whole surface, so that the shape of the projections to be formed on the flat surface of the top of substrate base 28 are formed by the viscous material penetrating portions 36A, as shown in FIG. 2. For example, as shown in FIGS. 4 and 5, when forming a plurality of partitions (projections) 40 extending in a longitudinal direction over the surface of substrate base 28, a plurality of slits 36A are formed on printing plate 36. The thickness of printing plate 36 determines the corresponding degree of projection of the projecting portions 40 to be formed, for example a level of 100 $\mu$m.

As the aforementioned printing plate 36, it is possible to employ (1) a printing plate formed by means of dispersing and affixing a ferromagnetic powder in a binding material, or (2) a printing plate in which openings are formed in a thin plate of a ferromagnetic substance.

As the material (1) in which a ferromagnetic powder has been dispersed and fixed in a binding material, it is possible to use a resin layer formed by means of adding a ferromagnetic powder to sections other than the viscous material penetrating portion forming the print pattern of a mesh screen woven using synthetic fabric such as nylon, polyester, and the like, or metallic thread such as stainless steel thread, and the like in this case, as the method for forming the aforementioned resin layer, a method can be appropriately employed in which a viscous material penetrating portion is formed by means of adding a ferromagnetic powder to a conventional photoresist, applying this substance to the aforementioned screen, exposing this resultant material to the reverse print pattern, and then removing unnecessary sections therein. As the aforementioned ferromagnetic material, any conventional ferromagnetic material may be employed such as iron, cobalt, nickel, as well as alloys of the aforementioned, oxides of magnetic materials, compounds of magnetic materials, and the like. Furthermore, it is also possible to form the printing plate from a resin to which metallic powder has been added (including so-called "rubber magnets", "plastic magnets", and the like) while omitting the aforementioned mesh screen, as long as a sufficient tensile strength can be obtained from just the resin. In this case, openings (viscous material-penetrating portion) in the shape of the print pattern are formed by means of etching or machine-working of the printing plate. In addition, it is also possible to form a mesh screen using a ferromagnetic substance.

Figure 6:
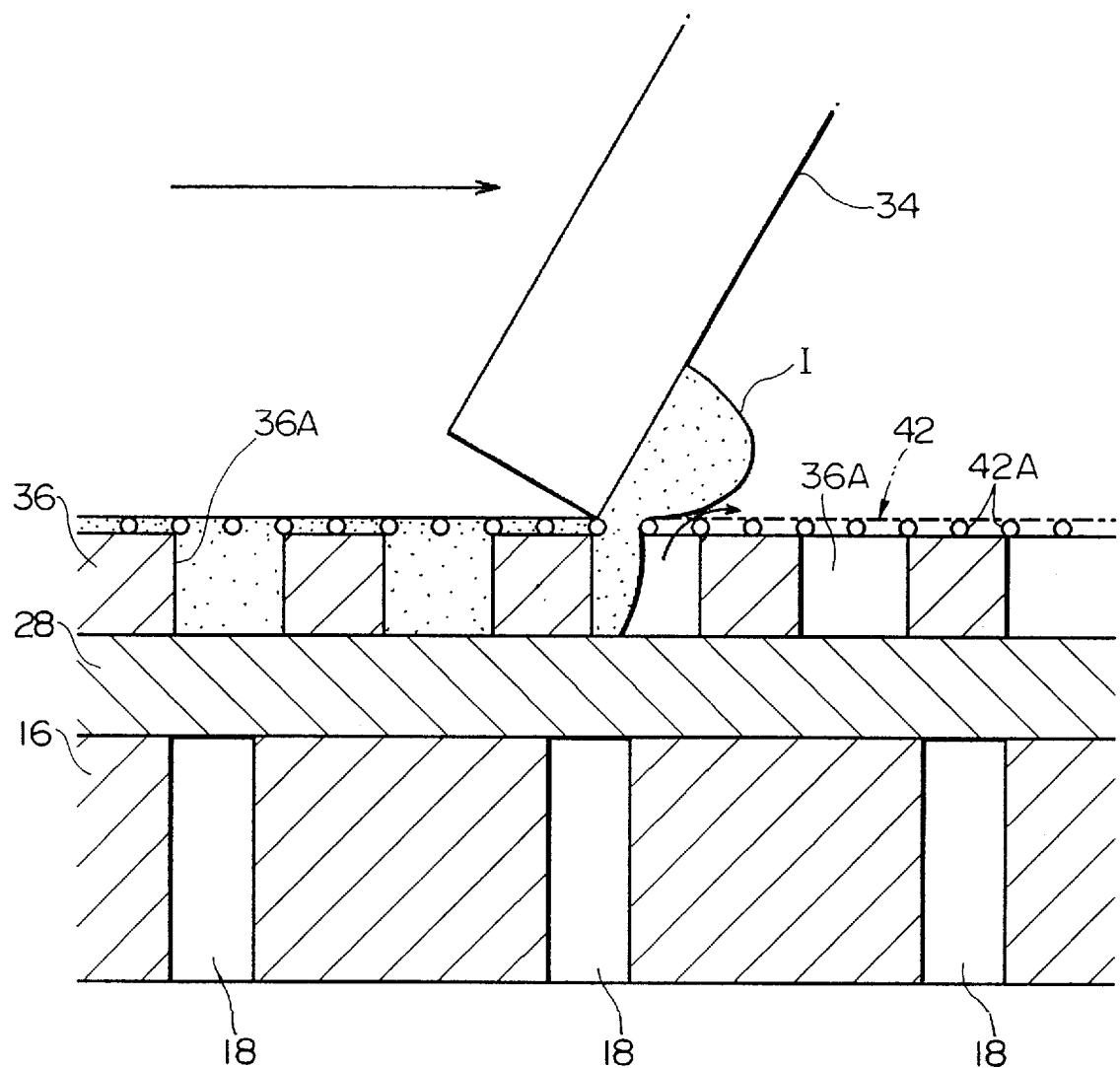
FIG. 6 is an enlarged cross sectional view showing the process of rubbing viscous material into a printing plate according to another embodiment of the invention of the present application.

As the aforementioned material (2), in which openings are formed in a ferromagnetic, metallic thin plate, a material can be used which is formed by punching a thin plate of a ferromagnetic metal such as soft iron, cobalt alloy, nickel alloy, and the like, working this plate by means of a procedure such as laser working, etching, or the like, and then constructing openings (viscous material-penetrating portion) forming the print pattern. In this aforementioned case, as shown in FIG. 6, it is also possible to laminate a screen 42 for reinforcement onto this metallic thin plate in which openings are formed.

Figure 3:
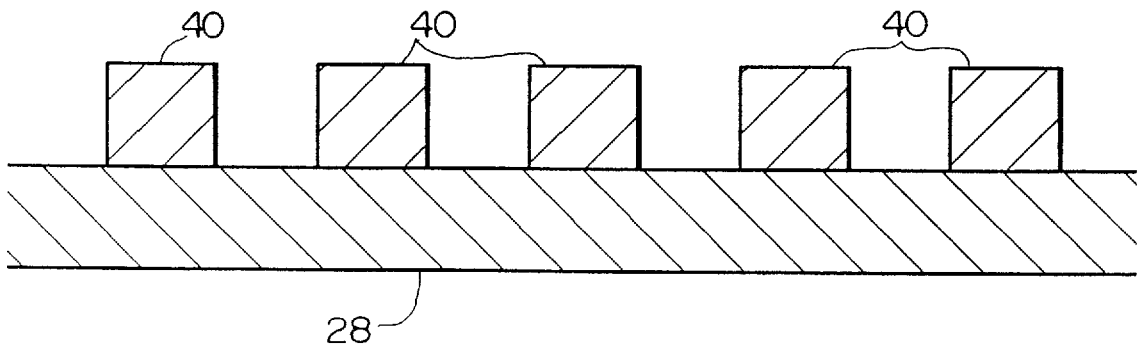
FIG. 3 is an enlarged cross sectional view of a substrate with projections manufactured according to the same embodiment.

Next, an example of a method for manufacturing a substrate having a plurality of parallel insulating partitions (projections), in the same manner as the back board/substrate and the like used in PDP, using the aforementioned device is explained with reference to FIGS. 1—3. In this case, a glass panel, for example, can be used as the substrate base 28, and a material which becomes an insulator after it solidifies can be used as a viscous material. However, the method of the invention of the present application is not limited to the manufacture of substrates for use in PDPs. In addition, for a different use, a material which becomes an electrical conductor after it solidifies can be used as a viscous material.

In the this manufacturing method, substrate base 28 is positioned on substrate supporting plate 16, and substrate base 28 is fixed to substrate supporting plate 16 by the activation of pressure reduction device 24. Printing plate 36 is fixed to the under surface of opening/closing base 12 so that when opening/closing base 12 is closed, printing plate 36 comes into contact with substrate base 28. In this condition, each electromagnet 20 is electrified by electric device 26 generating a magnetic force which fixes printing plate 36 onto substrate base 28 by means of magnetic attraction.

Next, viscous material I is placed onto printing plate 36; squeegee driving mechanism 30 is activated, thereby moving slider 32 in one direction or two directions (a round trip); and by means of squeegee 34, viscous material I is rubbed over the entire surface of printing plate 36. When this is done, viscous material I fills up the viscous material penetrating portions 36A, so that the upper surface of the viscous material I is level with the upper surface of the printing plate 36, as shown in FIG. 2. In this process, because the attractive force of electromagnets 20 clamps the entire surface of printing plate 36 onto substrate base 28, the viscous material which has filled the viscous material penetrating portions 36A does not leak into the space between the printing plate 36 and substrate base 28, and there is no print bleeding. In addition, because the printing plate 36 does not slip due to the rubbing force of the squeegee, there is no smudging.

When the rubbing by squeegee 34 is completed, the attraction of printing plate 36 is stopped by means of stopping the electricity to the electromagnets 20, opening/closing base 12 is lifted up, and printing plate 36 is removed from substrate base 28. In addition, the fixing of substrate base 28 due to pressure reduction device 24 is stopped, substrate base 28 is removed from substrate supporting plate 16, and a process for solidifying viscous material I takes place. The process for solidifying viscous material I differs in the following ways depending on the viscous material used.

When viscous material I is a heat curing material such as heat curing resin or the like, or contains a solvent which evaporates on heating, the substrate body onto which the viscous material has been printed is heated, and the viscous material I solidifies forming the projection 40. As heating methods, methods of heating the substrate base 28 in a heating furnace, methods of heating by irradiation with beams of infrared rays or the like, methods of heating by irradiation with microwaves, methods in which heating of substrate base 28 begins during printing and the like are possible. When far infra red rays, micro waves and the like are used for drying the viscous material I, the surface and inside of the viscous material are heated and solidify uniformly, so that the stresses remaining inside the projecting portions 40 are small, and the advantage of uniform quality is obtained.

When viscous material I contains a monomer or the like which solidifies by undergoing a polymerization reaction in a beam of a specific wave length, for example, ultra violet light, irradiation by a beam of that wave length will cause the viscous material I to solidify. In this case, because the temperature increase of the viscous material I and the substrate base 28 is small, even when materials with large thermal expansions are used, problems arising from strain, variation, and the like are few.

When a material containing a thermoplastic substance is used as viscous material I, the viscous material I is printed onto substrate base 28 in a melted state, then the melted viscous material I can solidify by cooling naturally or by being forcibly cooled.

When using particles of a sinterable material like glass particles which are the same material as the substrate 28, or the like which have been dispersed in a dispersion medium which decomposes in heat or evaporates like polyvinyl alcohol or the like as the viscous material, the projections 40 can be formed by sintering the particles or by removing the dispersion medium by heating.

By positioning a new substrate base 28 onto substrate supporting plate 16, and positioning printing plate 36 onto substrate base 28, the same aforementioned process can be repeated.

In the manufacturing method for the substrate having the aforementioned structure, printing plate 36 is attracted to substrate base 28 by means of the magnetic force of the electromagnets; thus, when viscous material I is being rubbed into printing plate 36, the adhesion between printing plate 36 and substrate base 28 is good, even when printing plate 36 is thick (for example, several 100 $\mu$m thick); and misalignments can be prevented. Consequently, distortions of viscous material I are not produced, printing position accuracy is high, and projections 40 of a desired shape can be easily formed with high precision. In addition, as a screen printing method is used, manufacturing efficiency of back boards for PDP and the like is improved, and the production cost can be reduced. In addition, as the set up of the shape of the projections is formed by the viscous material penetrating portions 36A of printing plate 36 alone, freedom in the design of the projecting portions 40 is improved.

Furthermore, as shown in FIG. 6, a thin screen 42 fixed to the surface of printing plate 36 by means of an adhesive agent or the like, can maintain the accuracy of the shape of the viscous material penetrating portions 36A. In this case, it is preferable that the threads of the mesh of the screen 42 be finer than the width of the smallest opening of the viscous material penetrating portions 36A. In this case, the longitudinal threads and the lateral threads 42A of the screen 42 are arranged so that they cross over the viscous material penetrating portions 36A, when the viscous material I fills up the inside of the viscous material penetrating portions 36A, the entire opening of the viscous material penetrating portions 36 are at no time blocked, so the air in the viscous material penetrating portions 36A flows out easily, giving the advantage that it is difficult for bubbles to be left in the viscous material I after the viscous material penetrating portions have been filled.

Figure 7:
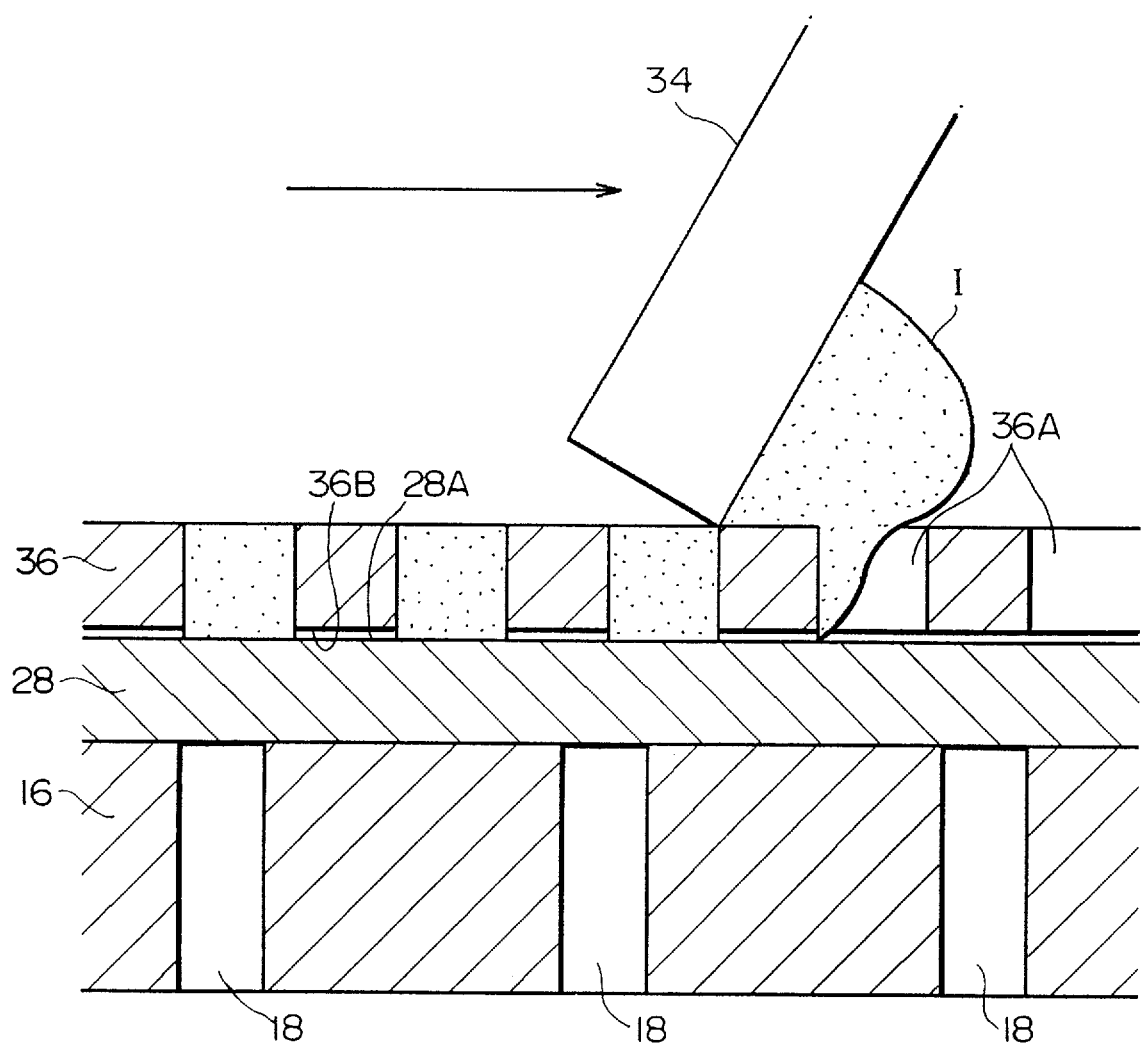
FIG. 7 is an enlarged cross sectional view showing the process of rubbing the viscous material into a printing plate according to another embodiment of the present invention.
Figure 8:
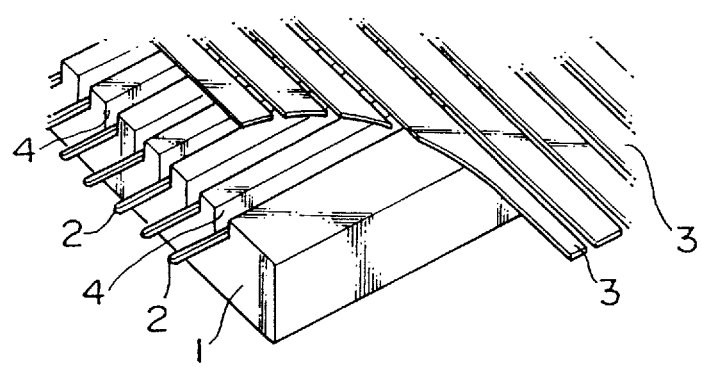
FIG. 8 is a perspective view showing the essential parts of a common plasma display panel.

In addition, as shown in FIG. 7, as a means to make it easier for the outflow of air from viscous material penetrating portions 36A, the under surface 36B of printing plate 36 and/or the upper surface 28A of the substrate base 28 can be roughened producing a small number of gaps between the contacting surfaces. These gaps are limited in size to the extent that viscous material I which contain particles does not flow into them. Instead of roughening the under surface 36A of printing board 36 or the upper surface 28A of substrate base 28, minute balls (beads) of plastic, glass, ceramic, or the like can be spread uniformly over the entire area of the boundary surface between substrate base 28 and printing plate 36. As the spread beads get caught in between the substrate base 28 and the printing plate 36, their diameter must be such that they form suitably small gaps. It is also possible for some of the beads to be taken into the viscous material I.

Particles of glass, ceramic, and the like which are of a different type material to the substrate base 28, can be dispersed in the viscous material I. Furthermore, as shown in FIG. 5, while only the lower layer 40A of the projections 40 which are in contact with substrate base 28 is made of a very similar material to that of substrate base 28, the upper layer 40B can be formed from an inexpensive insulator resin or the like. In this case, while manufacturing costs are controlled, the bonding strength between projecting portions 40 and substrate body 28 can be increased.

To make projecting portions 40 multilayered, lower layer 40A is printed using first printing plate 36, after this lower layer 40A has solidified, upper layer 40B is printed onto lower layer 40A and allowed to solidify using a second printing plate which has a penetrating portion pattern which is the same as that of first printing plate. Alternatively, the same printing plate can be used to form a two layered structure in projecting portions 40 by rubbing two different viscous materials I into the printing plate 36 in two separate steps. In the same ways, it is possible to form 3 or more layers in projecting portions 40.

Furthermore, in the aforementioned example, the magnet force is controlled by turning the supply of electricity to the electromagnets on and off, on the other hand, the magnetic force of the electromagnets can be controlled by positioning the substrate base 28 closer to or further away from the electromagnets 20. In this case, permanent magnets can be used in place of electromagnets 20.

In addition, it is possible to use a magnetic force front above printing plate 36 to attract the entire surface of printing plate 36 to raise printing plate 36 off substrate base 28. In this case, not only is it possible to stably separate printing plate 36 without producing any strain, it is possible to lift printing plate 36 exactly in the direction of the projecting portions 40, so that the shape of projecting portions 40 is not damaged.

In addition, the invention of the present application is not limited to insulated back boards for use in flat display panels, it can also be applied to the manufacture of print boards which have electrically conductive layers bearing circuit patterns. In this case, it is also possible to print a circuit pattern from a cream solder, in which minute solder particles in flux, organic solvent or the like have been dispersed, onto a substrate base 28 having insulation material of glass epoxy, any type of plastic, or the like. The substrate base 28 can then be heated, the solder particles melted, and the solder layer can be formed. In order to increase the bonding strength of the solder, in advance, a thin metallic membrane of copper, or the like can be formed on the surface of substrate base 28, after the solder layer has been shaped, all the metallic membrane except that part covered by the solder layer can be removed by etching or the like. When the solder is melted, solder which has flowed into gaps between parts positioned on substrate base 28 and substrate base 28 can solder those parts to the surface of substrate base 28, and the solder can also fill up grooves formed in substrate base 28.

In addition, as a method for manufacturing a print board, an insulated substrate on which a metallic foil has been formed can be used as a substrate base 28, after thickly printing an insulating masking material onto the surface of the metal foil, the masking material solidifies, and the remaining metallic foil can be removed by etching, or the masking material can be removed.

In addition, substrate base 28 is not limited to rigid substances, if necessary, a flexible material like leather, fabric, or the like can be used as substrate base 28. When printing on substrates formed from these materials, it is generally difficult to maintain evenness, and thick printing is particularly problematic. In the method of the invention of the present application as the printing plate is clamped to the substrate by means of magnetic force, misalignment can be stopped, viscous material can be thickly printed with exactness over a large area, and projecting portions can be formed with high accuracy.

In addition, a pulverized form of the aforementioned ferromagnetic material can be mixed in with the viscous material I, when printing plate 36 is peeled off from substrate base 28, the viscous material I which has been kept in the viscous material penetrating portions 36A can be attracted by mean of magnetic force toward substrate base 28, thus the extraction of the viscous material from the viscous material penetrating portions can be improved.

Furthermore, it is possible to form irregularities of various shapes by preparing unevenness in the viscous material penetrating portions 36A. However, the unevenness in the viscous material penetrating portions should be formed so as not to cause damage to the shape of the printed viscous material when the printing plate 36 is peeled of from substrate base 28.

Furthermore, in order to facilitate filling up viscous material penetrating portions 36A of the printing plate 36 with the viscous material I, the following methods can be employed.

i) Reducing the atmospheric pressure around the printing plate 36 by an evaporating system when the viscous material I is rubbed on the printing plate 36, and restoring the atmospheric pressure when the rubbing is finished.

ii) In addition to the above-described roughening of the under surface 36A of the printing plate 36 and/or the upper surface 28A of the substrate base 28, forming a plurality of narrow grooves on the lower surface of the printing plate 36, and evaporating from a gap between the printing plate 36 and substrate base 28 through the grooves only when the viscous material I is rubbed on the printing plate 36. The same method can be employed in the case where minute balls (beads) are spread over the boundary surface between substrate base 28 and printing plate 36.

Furthermore, in the present invention, the minimum opening width of the viscous material penetrating portions 36A is preferably more than 10 microns. In the case where the minimum opening width is less than 10 microns, the risk arises that the projections to be formed on the substrate base 28 will be deformed after printing.

What is claimed is:

1. A manufacturing method for a substrate having a surface with projections comprising the steps of:

preparing a printing plate, with at least one part formed from a ferromagnetic material, and which has viscous material penetrating portions for forming projections on a flat surface, contacting said printing plate with the surface of a substrate so as to form gaps, for allowing the outflow of air from said viscous material penetrating portions, between contacting surfaces of said printing plate and said substrate, said gaps being limited in size to the extent that viscous material does not flow thereinto, clamping said printing plate to said substrate by means of attraction by a magnetic force from behind said substrate, filling said viscous material penetrating portions of said printing plate with a viscous material for forming projections, forming from said viscous material a layer on said substrate in a shape the same as that of said projections, separating said printing plate from said substrate, solidifying said viscous material printed onto said substrate forming projections.

2. A substrate manufacturing method according to claim 1, wherein said viscous material is rubbed into said viscous material penetrating portions in the surface of said printing plate by means of a squeegee which has a rubbing action.

3. A substrate manufacturing method according to claim 1, wherein a viscose material containing a dispersion medium in which particles of an insulating material are dispersed is used as said viscous material.

4. A substrate manufacturing method according to claim 3, wherein the step of solidifying said viscous material, in which said particles are baked by heating said substrate on which said viscous material has been printed, is provided.

5. A substrate manufacturing method according to claim 1, wherein said step of solidifying said viscous material comprises a step of using a viscous material containing a substance which solidifies in ultraviolet light and said viscous material is solidified by irradiation with ultraviolet light.

6. A substrate manufacturing method according to claim 1, comprising a step of using a dispersion medium in which metallic particles have been uniformly dispersed as said viscous material.

7. A substrate manufacturing method according to claim 1, comprising a step of rubbing said viscous material into said viscous material penetrating portions of said printing plate in which said viscous material contains a thermoplastic substance and said viscous material is melted before rubbing in; and comprising a step of solidification in which said melted viscous material is solidified by cooling.

8. A substrate manufacturing method according to claim 1, in which, after said printing process, a step is provided in which said force of attraction of said magnetic force from behind said substrate base is weakened, and said printing plate is separated from said substrate body by means of attraction from a magnetic force from above said printing plate.

9. A substrate manufacturing method according to claim 1, in which, after said viscous material printed on said substrate base has solidified, a method of printing a second viscous material on top of said solidified viscous material is provided in which said second viscous material is printed in the same way as said first viscous material.

10. A substrate manufacturing method according to claim 1, wherein fabric or leather is used as said substrate base.

11. A substrate manufacturing method according to claim 1, wherein a screen is fixed over the upper surface of said printing plate.

12. A substrate manufacturing method according to claim 1, wherein at least one of the lower surface of said printing plate and the upper surface of said substrate base are roughened.

13. A substrate manufacturing method according to claim 1, wherein beads are spread in between said substrate base and said printing plate when said printing plate is applied to said substrate base.

14. A substrate manufacturing method according to claim 1, wherein said substrate is a flat display panel back surface substrate on which a plurality of projections are formed on the surface of an insulated substrate base.

15. A substrate manufacturing method according to claim 1, wherein said substrate is a printed circuit board on which an electricity conducting circuit pattern is formed on an insulating substrate base.

* * * * *